United States Patent
Jang et al.

(10) Patent No.: US 7,829,189 B2
(45) Date of Patent: Nov. 9, 2010

(54) ALLOY-TYPE SEMICONDUCTOR NANOCRYSTALS

(75) Inventors: Eun-joo Jang, Suwon-si (KR); Tae-Kyung Ahn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 431 days.

(21) Appl. No.: 11/819,224

(22) Filed: Jun. 26, 2007

(65) Prior Publication Data

US 2007/0273275 A1     Nov. 29, 2007

Related U.S. Application Data

(62) Division of application No. 10/885,033, filed on Jul. 7, 2004, now Pat. No. 7,250,082.

(30) Foreign Application Priority Data

Jul. 19, 2003 (KR) ............... 10-2003-0049547

(51) Int. Cl.
   *B32B 5/16* (2006.01)
(52) U.S. Cl. .................. 428/402; 977/777; 977/824; 977/825
(58) Field of Classification Search ........... 428/402; 977/777, 810, 824, 825
   See application file for complete search history.

(56) References Cited

U.S. PATENT DOCUMENTS

| | | | |
|---|---|---|---|
| 5,294,874 A * | 3/1994 | Hessenberger et al. ...... 318/759 |
| 5,559,057 A * | 9/1996 | Goldstein ................ 438/725 |
| 6,207,229 B1 | 3/2001 | Bawendi et al. |
| 6,225,198 B1 * | 5/2001 | Alivisatos et al. .......... 438/497 |
| 6,306,736 B1 | 10/2001 | Alivisatos et al. |
| 6,322,901 B1 | 11/2001 | Bawendi et al. |
| 6,538,374 B2 * | 3/2003 | Hosokawa ............... 313/504 |
| 6,803,122 B2 * | 10/2004 | Shirakawa et al. .......... 428/690 |
| 6,872,450 B2 | 3/2005 | Liu et al. |
| 6,878,184 B1 | 4/2005 | Rockenberger et al. |

(Continued)

FOREIGN PATENT DOCUMENTS

JP     03-262170     * 11/1991

(Continued)

OTHER PUBLICATIONS

Notice to Submit Response issued by the Korean Intellectual Property Office in Korean Application No. 10-2003-0049547, Jun. 20, 2006, Korea, and English translation thereof.

(Continued)

*Primary Examiner*—H. (Holly) T Le
(74) *Attorney, Agent, or Firm*—Cantor Colburn LLP (57) ABSTRACT

Provided is a chemical wet preparation method for Group 12-16 compound semiconductor nanocrystals. The method includes mixing one or more Group 12 metals or Group 12 precursors with a dispersing agent and a solvent followed by heating to obtain a Group 12 metal precursor solution; dissolving one or more Group 16 elements or Group 16 precursors in a coordinating solvent to obtain a Group 16 element precursor solution; and mixing the Group 12 metal precursors solution and the Group 16 element precursors solution to form a mixture, and then reacting the mixture to grow the semiconductor nanocrystals. The Group 12-16 compound semiconductor nanocrystals are stable and have high quantum efficiency and uniform sizes and shapes.

3 Claims, 4 Drawing Sheets

U.S. PATENT DOCUMENTS

| | | |
|---|---|---|
| 6,906,339 B2 | 6/2005 | Dutta |
| 6,998,773 B2 * | 2/2006 | Hosokawa et al. ........... 313/506 |
| 7,056,471 B1 * | 6/2006 | Han et al. .................... 420/523 |
| 7,118,810 B2 * | 10/2006 | Park et al. .................... 428/690 |
| 7,166,010 B2 * | 1/2007 | Lamansky et al. ............. 445/24 |
| 7,190,870 B2 * | 3/2007 | Sundar et al. ................ 385/129 |
| 7,250,082 B2 * | 7/2007 | Jang et al. ...................... 117/68 |
| 7,288,468 B2 * | 10/2007 | Jang et al. .................... 438/500 |
| 2005/0051769 A1 | 3/2005 | Jang et al. |
| 2008/0012031 A1 * | 1/2008 | Jang et al. ...................... 257/89 |
| 2009/0220792 A1 * | 9/2009 | Ying et al. .................... 428/403 |

FOREIGN PATENT DOCUMENTS

| | | |
|---|---|---|
| WO | WO 0178464 A1 * | 10/2001 |
| WO | WO 2007/102799 * | 9/2007 |

OTHER PUBLICATIONS

Oct. 27, 2006 First Office Action and English-language translation issued in Chinese counterpart Application No. 2004100637815.

* cited by examiner

FIG. 6

ALLOY-TYPE SEMICONDUCTOR NANOCRYSTALS

BACKGROUND OF THE INVENTION

This application claims priority from Korean Patent Application No. 2003-49547, filed on Jul. 19, 2003, in the Korean Intellectual Property Office, the disclosure of which is incorporated herein in its entirety by reference.

1. Field of the Invention

The present invention relates to alloy type semiconductor nanocrystals and a method of preparing the same. More particularly, the present invention relates to alloy type Group 12-16 compound semiconductor nanocrystals with a high luminance efficiency in a visible light band and a wet preparation method for the semiconductor nanocrystals.

2. Description of the Related Art

When compound semiconductor materials are made into nanometer-sized crystals, a quantum confinement effect occurs at the regions of the crystals smaller than the bulk exciton Bohr radius. Such a quantum confinement effect results in a change in bandgap energy which is intrinsic characteristics of semiconductor materials. In a case where visible light-emitting compound semiconductor materials are made into nanocrystals, a bandgap energy commences to increase when the size of the nanocrystals reaches below a specific level. As a result, the smaller sized nanocrystals exhibit a blue shift of a luminance band. Based on such size-dependent optical characteristics of quantum dot materials, adjustments of intrinsic properties, structures, shapes, and sizes of the quantum dot materials enable a change in an energy bandgap, which allows formation of various energy levels.

Studies have been done on a quantum dot growth technology as the most important technology among next generation semiconductor device development technologies. In particular, metal organic chemical deposition (MOCVD) and molecular beam epitaxy (MBE) which are conventional vapor phase deposition processes are promising technologies which allow a control of a semiconductor thin film to a single atomic layer level and a controllable growth of quantum dots. Even though quantum dots grown mainly by lattice mismatch using a vapor phase method have good crystallinity, the vapor phase method has a fatal defect in controlling the size, uniformity, and density of the quantum dots, which renders fabrication of commercially available semiconductor devices difficult.

In view of these problems, there was an attempt to grow quantum dots using a chemical wet method. According to the chemical wet method, quantum dot crystal precursor materials grow into quantum dot crystals in a coordinating organic solvent. The organic solvent spontaneously coordinates with the surfaces of the quantum dot crystals. At this time, the organic solvent serves as a dispersing agent to control the size of the quantum dot crystals to a nanometer level.

U.S. Pat. No. 6,225,198 B1 discloses a method for forming Group 12-16 compound semiconductor quantum dots. According to the method disclosed in this patent, a Group 12 metal (Zn, Cd, or Hg) containing material which is a Group 12 precursor is dissolved in a first dispersion and a Group 16 element (S, Se, or Te) containing material which is a Group 16 precursor is dissolved in a second dispersion. A solvent capable of dissolving the two precursors is added to a mixture of the two dispersions and maintained at a temperature sufficient to promote the growth of Group 12-16 compound semiconductor crystals. When the sizes of the compound semiconductor crystals reach a desired level, the crystals are separated. However, this method has a restriction on the solvent used, i.e., tri-octyl phosphoric acid (referred to as TOPO, hereinafter). TOPO is commercially available only as technical grade (about 90% pure) TOPO. Reportedly, it is difficult to form reproducible and uniform quantum structures in a solvent containing a large amount of impurities. It is also reported that impurities in the technical grade TOPO serves as an uncontrollable reaction parameter that adversely affects the reaction. In this regard, substitution of pure (99%) TOPO for the technical grade TOPO can be considered. In this case, however, a change in a binding property of TOPO may occur, which renders the growth of desired crystals difficult.

U.S. Pat. No. 6,306,736 discloses a method for forming Group 3-5 compound semiconductor quantum dots. Here, the above-described method for forming Group 12-16 compound semiconductor quantum dots is used as it is.

U.S. Pat. No. 6,322,901B1 discloses high-luminescent core-shell quantum dot materials and U.S. Pat. No. 6,207,229 discloses a method for preparing core-shell quantum dot materials. It is reported that the core-shell compound semiconductor quantum dots thus formed exhibit an increase in luminance efficiency by 30 to 50%.

SUMMARY OF THE INVENTION

The present invention provides alloy type Group 12-16 compound semiconductor nanocrystals which are stable and have a high quantum efficiency and uniform sizes and shapes.

The present invention also provides a simple, reproducible, chemical wet preparation method for the alloy type Group 12-16 compound semiconductor nanocrystals.

The present invention also provides an organic electroluminescent (EL) device with good luminance characteristics using the Group 12-16 compound semiconductor nanocrystals.

According to an aspect of the present invention, there is provided a method for preparing semiconductor nanocrystals including: (a) mixing one or more Group 12 metals or Group 12 precursors with a dispersing agent and a solvent followed by heating to obtain a Group 12 metal precursor solution; (b) dissolving one or more Group 16 elements or Group 16 precursors in a coordinating solvent to obtain a Group 16 element precursor solution; and (c) mixing the Group 12 metal precursors solution and the Group 16 element precursors solution to form a mixture, and then reacting the mixture to grow the semiconductor nanocrystals.

According to another aspect of the present invention, there is provided semiconductor nanocrystals having three or more component alloy quantum structures comprised of one or more Group 12 metals and one or more Group 16 elements. The semiconductor nanocrystals may be ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, or CdHgSeTe.

According to yet another aspect of the present invention, there is provided an organic EL device including an organic film interposed between a pair of electrodes, the organic film including the above-described semiconductor nanocrystals.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention provides a method for preparing semiconductor nanocrystals which includes: mixing at least one Group 12 metal/precursor with a dispersing agent and a solvent followed by heating at a predetermined temperature to obtain a uniform solution; dissolving at least one Group 16 element/precursor in an appropriate coordinating solvent; and mixing the solution containing the Group 16 element/precursor with the solution containing the Group 12 metal/precursor that has been maintained at a predetermined temperature to grow the semiconductor nanocrystals. The semiconductor nanocrystals prepared through this simple process have Group 12-16 compound semiconductor quantum structures with a very narrow size distribution (full width at half maximum (FWHM)<30 nm), high luminance efficiency (>50%), and good reproducibility. In particular, three or more component compound semiconductor quantum dots have excellent crystallinity. Also, uniform compound semiconductor quantum dots can be obtained without a selective separation process.

Three or more component compound semiconductor nanocrystals can be prepared by dissolving at least one Group 12 metal/precursor in a solvent and a dispersing agent to obtain a Group 12 metal precursor solution, and adding two or more Group 16 element precursor solutions obtained by dissolving two or more Group 16 elements/precursors in a solvent to the Group 12 metal precursor solution, in sequence or at a time. The compound semiconductor nanocrystals can have a specific crystal structure according to a reaction rate difference and a mixture ratio between different elements. Furthermore, the compound semiconductor nanocrystals can have specific bandgap and luminance efficiency according to the types of the used elements or precursors.

A method for preparing semiconductor nanocrystals according to the present invention will now be described in detail.

First, at least one Group 12 metal/precursor is mixed with a dispersing agent and a solvent and heated at a predetermined temperature to obtain a Group 12 metal precursor solution.

The Group 12 metal may be Zn, Cd, Hg, or a mixture thereof. The Group 12 precursor is a material that is relatively stable in air and does not generate noxious gases during addition of the precursor, for example, a Group 12 metal oxide, a Group 12 metal halide, or a Group 12 metal organic complex. Examples of the Group 12 precursor include zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, and a mixture thereof.

The dispersing agent as used herein is a material that reacts with the Group 12 metal/precursor to form a Group 12 metal complex. The coordinating capacity of the dispersing agent and the growth rate on a specific crystalline surface can vary according to the type and concentration of the dispersing agent. Therefore, the dispersing agent is a factor that has an important effect on the sizes and shapes of semiconductor nanocrystals to be finally obtained.

The dispersing agent may be a weakly acidic organic material, for example, an alkylcarboxylic acid having from 2 to 18 carbon atoms with a COOH end group, an alkenylcarboxylic acid having from 2 to 18 carbon atoms with a $PO_3H$ end group, an alkylsulfonic acid having from 2 to 18 carbon atoms with a $SO_3H$ end group, or an alkenylsulfonic acid having from 2 to 18 carbon atoms. The dispersing agent may also be a weakly basic organic material, for example, an alkylamine having from 2 to 18 carbon atoms with a $NH_2$ end group or an alkenylamine having from 2 to 18 carbon atoms with a $NH_2$ end group. Examples of the dispersing agent include oleic acid, stearic acid, palmitic acid, hexyl phosphonic acid, n-octyl phosphonic acid, tetradecyl phosphonic acid, octadecyl phosphonic acid, n-octyl amine, and hexyldecyl amine.

Preferably, the molar ratio of the Group 12 metal/precursor to the dispersing agent is in a range of 1:0.1 to 1:100, more preferably, 1:1 to 1:20, still more preferably, 1:2 to 1:8. If the molar ratio of the dispersing agent is less than 0.1, the Group 12 metal/precursor may be unstable. On the other hand, if it exceeds 100, control of a reaction rate may be difficult and nanocrystals may have a broad size distribution.

The solvent as used herein is a solvent that contains a lesser amount of impurities, is in a liquid state at room temperature, and has an appropriate coordinating capacity. The solvent may be a primary alkyl amine having from 6 to 22 carbon atoms, a secondary alkyl amine having from 6 to 22 carbon atoms, a tertiary alkyl amine having from 6 to 22 carbon atoms, a nitrogen-containing hetero ring compound having from 6 to 22 carbon atoms, a sulfur-containing hetero ring compound having from 6 to 22 carbon atoms, an alkane having from 6 to 22 carbon atoms, an alkene having from 6 to 22 carbon atoms, or an alkyne having from 6 to 22 carbon atoms. Examples of the primary alkyl amine include dodecylamine, hexadecylamine, and dimethyldodecylamine. The secondary alkyl amine may be dioctylamine and the tertiary alkyl amine may be trioctylamine. The nitrogen-containing hetero ring compound may be isopropyl-2,3-diphenylaziridine, the sulfur-containing hetero ring compound may be dimethylsulfolane, the alkane may be octadecane, the alkene may be octadecene, and the alkyne may be dodecyne.

The solvent must have an appropriate coordinating capacity and crystalline nuclei dispersability and, at the same time, be stable at a high reaction temperature. In this regard, the solvent may have carbon-carbon bonds of more than a predetermined length, and the solvent have preferably 6-18 carbon atoms. The solvent must have solubilizability for metals or precursors that make compound semiconductor nanocrystals.

The mixture ratio of the Group 12 metal/precursor to the solvent is in a range of 0.1:1 to 1:100, preferably 0.5:1 to 1:40, and more preferably, 1:1 to 1:20.

The concentration of the Group 12 metal precursor solution is in a range of 0.001 to 2 M, preferably, 0.005 to 0.5 M, and more preferably, 0.01 to 0.1 M.

Next, at least one Group 16 element/precursor is dissolved in a coordinating solvent to obtain a Group 16 element precursor solution.

The Group 16 element may be sulfur (S), selenium (Se), tellurium (Te), or an alloy thereof. The Group 16 precursor may be S powders, Se powders, Te powders, trimethylsilyl sulfur (S(TMS)), trimethylsilyl selenium (Se(TMS)), or trimethylsilyl tellurium (Te(TMS)).

The solvent may be the same solvent as used in the preparation of the Group 12 metal precursor solution that can coordinate with the Group 16 element/precursor. Among examples of the solvent used in the preparation of the Group 12 metal precursor solution, the alkane, the alkene, and the alkyne hardly coordinate with the Group 16 element/precursor, and the alkyl amine, the alkyl phosphonic acid, the nitrogen-containing hetero ring, and the sulfur-containing hetero ring slightly coordinate with the Group 16 element/precursor.

The mixture ratio of the Group 16 element/precursor to the solvent is in a range of 0.1:1 to 1:100, preferably 0.5:1 to 1:40, and more preferably 1:1 to 1:20.

The concentration of the Group 16 element precursor solution is in a range of 0.001 to 2 M, preferably 0.01 to 0.5 M. If the concentration of the Group 16 element precursor solution is less than 0.01 M, separation of nanocrystals from a reaction solution may be difficult. On the other hand, if it exceeds 0.5 M, the nanocrystals may have a broad size distribution.

The Group 16 element precursor solution and the Group 12 metal precursor solution are mixed and reacted so that crystal growth occurs to thereby obtain Group 12-16 compound semiconductor nanocrystals.

The Group 16 element precursor solution containing two or more Group 16 elements/precursors may be added to the Group 12 metal precursor solution as the following two methods.

In a first method, two or more Group 16 element precursor solutions containing the two or more Group 16 elements/precursors are added to the Group 12 metal precursor solution at a time.

In a second method, two or more Group 16 element precursor solutions containing the two or more Group 16 elements/precursors are sequentially added to the Group 12 metal precursor solution.

According to the first method, there can be obtained alloy type multi-component (three or more components) semiconductor nanocrystals comprised of at least one Group 12 metal and two or more Group 16 elements and having. In the semiconductor nanocrystals, core portion and shell portion have same structure. Examples of the compound semiconductor nanocrystals include ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, and CdHgSeTe. These three or more component compound semiconductor nanocrystals can have an appropriate bandgap by adjusting the ratio of the precursors used, unlike core-shell quantum structures as will be described later. In particular, a luminance efficiency increases only at a specific ratio of the precursors.

According to the second method, first added Group 12 metal and two or more Group 16 elements are formed core portion, and then added Group 12 metal and two or more Group 16 elements are formed shell portion, so that CdSe/CdS, CdTe/CdS, CdS/CdSe, CdS/CdTe, ZnSe/ZnS, ZnTe/ZnS, ZnS/ZnSe, ZnS/ZnTe, or ZnSe/ZnS core/shell semiconductor nanocrystals can be obtained.

The heating temperature for obtaining the Group 12 metal precursor solution is in a range of 100 to 400° C., preferably, 200 to 350° C., and more preferably, 300 to 350° C. If the heating temperature is less than 100° C., crystal grown may be difficult. On the other hand, if it exceeds 400° C., selection of a stable solvent and control of crystal growth rate may be difficult.

Crystal growth from a mixture of the Group 12 metal precursor solution and the Group 16 element precursor solution lasts for 1 second to 10 hours, preferably, 10 seconds to 5 hours, and more preferably, 30 seconds to 2 hours. If the duration of the crystal growth is outside the range, control of a reaction rate may be difficult.

The Group 12 metal precursor solution containing one or more Group 12 metals/precursors may be mixed with the Group 16 element precursor solution as the following two methods.

In a first method, one or more Group 12 metal precursor solutions containing the one or more Group 12 metals/precursors are sequentially mixed with the Group 16 element precursor solution.

In a second method, oner more Group 12 metal precursor solutions containing the one or more Group 12 metals/precursors are mixed with the Group 16 element precursor solution at a time.

The quantum structures of the semiconductor nanocrystals thus prepared are not particularly limited and may be in shapes of spheres, rods, tripods, tetrapods, cubes, boxes, or stars.

Three or more component compound semiconductor nanocrystals prepared according to a method of the present invention have a luminance wavelength region of 300 to 1,300 nm, and a luminance efficiency of 30% or more, preferably 50% or more.

As seen from the fact that FWHM of PL spectrum that represents a size distribution of quantum structures is 50 nm or less, preferably 30 nm or less, the three or more component compound semiconductor nanocrystals are nanoparticles with a uniform size distribution.

Meanwhile, three or more component alloy type semiconductor nanocrystals comprised of at least one Group 12 metal and one or more Group 16 elements and having indecomposable core-shell structures can be widely used in the fields of displays, sensors, and energies. In particular, the three or more component semiconductor nanocrystals are useful in formation of an organic film, in particular, a light emission layer of an organic EL device. These semiconductor nanocrystals may be incorporated in a light emission layer by vapor deposition, sputtering, printing, coating, ink-jet, or e-beam. The thickness of an organic film may be in a range of 50 to 100 nm. The organic film as used herein indicates a film made of an organic compound that is interposed between a pair of electrodes in an organic EL device and includes an electron transport layer, a hole transport layer, and the like, except the light emission layer.

Such an organic EL device may be formed with a commonly known non-limiting structure of anode/light emission layer/cathode, anode/buffer layer/light emission layer/cathode, anode/hole transport layer/light emission layer/cathode, anode/buffer layer/hole transport layer/light emission layer/cathode, anode/buffer layer/hole transport layer/light emission layer/electron transport layer/cathode, or anode/buffer layer/hole transport layer/light emission layer/hole blocking layer/cathode.

The buffer layer may be made of a commonly used material, preferably, copper phthalocyanine, polythiophene, polyaniline, polyacetylene, polypyrrole, polyphenylene vinylene, or a derivative thereof, but is not limited thereto.

The hole transport layer may be made of a commonly used material, preferably, polytriphenylamine, but is not limited thereto.

The electron transport layer may be made of a commonly used material, preferably, polyoxadiazole, but is not limited thereto.

The hole blocking layer may be made of a commonly used material, preferably, LiF, $BaF_2$, or $MgF_2$, but is not limited thereto.

An organic EL device of the present invention can be manufactured according to a common method using a light emission material without using a particular apparatus or method.

Hereinafter, the present invention will be described more specifically by Examples. However, the following Examples are provided only for illustrations and thus the present invention is not limited to or by them.

EXAMPLE 1

Preparation of CdSeS Nanocrystals 16 g of tri-octyl amine (referred to as TOA, hereinafter), 0.5 g of oleic acid, and 0.4 mmol of CdO were simultaneously placed in a 100 ml flask provided with a reflux condenser and stirred at 300° C. to obtain a Cd precursor solution.

Separately, Se powders were dissolved in tri-octyl phosphine (referred to as TOP, hereinafter) to obtain a Se-TOP complex solution with a Se concentration of about 0.1 M. S powders were dissolved on TOP to obtain S-TOP complex solution with a S concentration of about 4 M.

0.5 ml of S-TOP complex solution 0.5 ml of the Se-TOP complex solution were rapidly added to the Cd precursor solution and stirred for about 4 minutes.

When the reaction of the resultant mixture was terminated, the reaction temperature was rapidly reduced to room temperature and then centrifugation was performed with addition of an ethanol as a non-solvent. A supernatant was decanted and discarded. A precipitate was dispersed in a toluene and then a PL spectrum in the solution was measured.

The PL spectrum showed an emission wavelength of about 580 nm and FWHM of about 30 nm.

Figure 1:
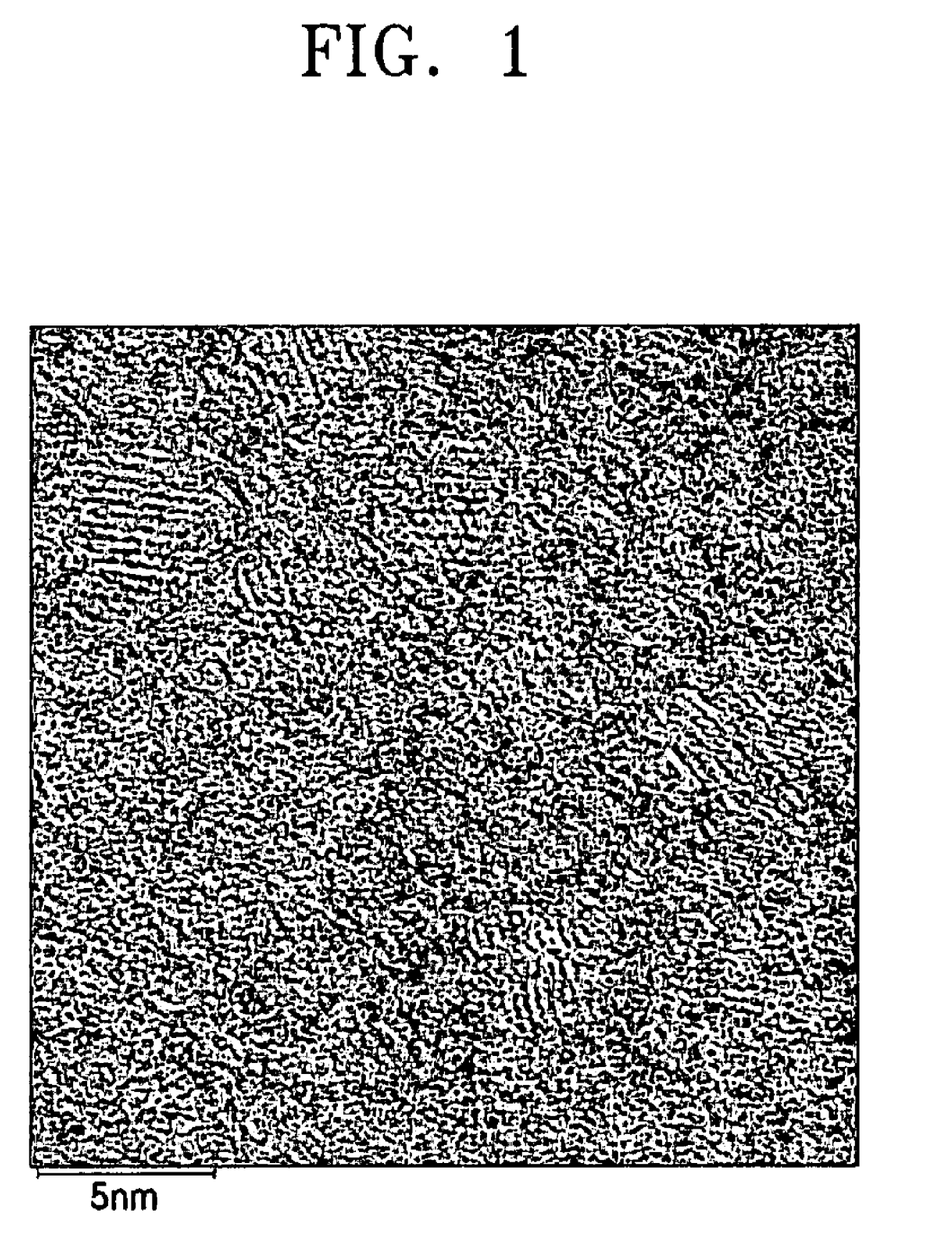
FIG. 1 is a high resolution, transmission electron microscopic (TEM) image (scale bar =5 nm) of CdSeS nanocrystals according to Example 1 of the present invention.

FIG. 1 shows a high-resolution TEM image of the CdSeS nanocrystals thus obtained. As shown in FIG. 1, the nanocrystals exhibited uniform shapes and sizes.

Figure 2:
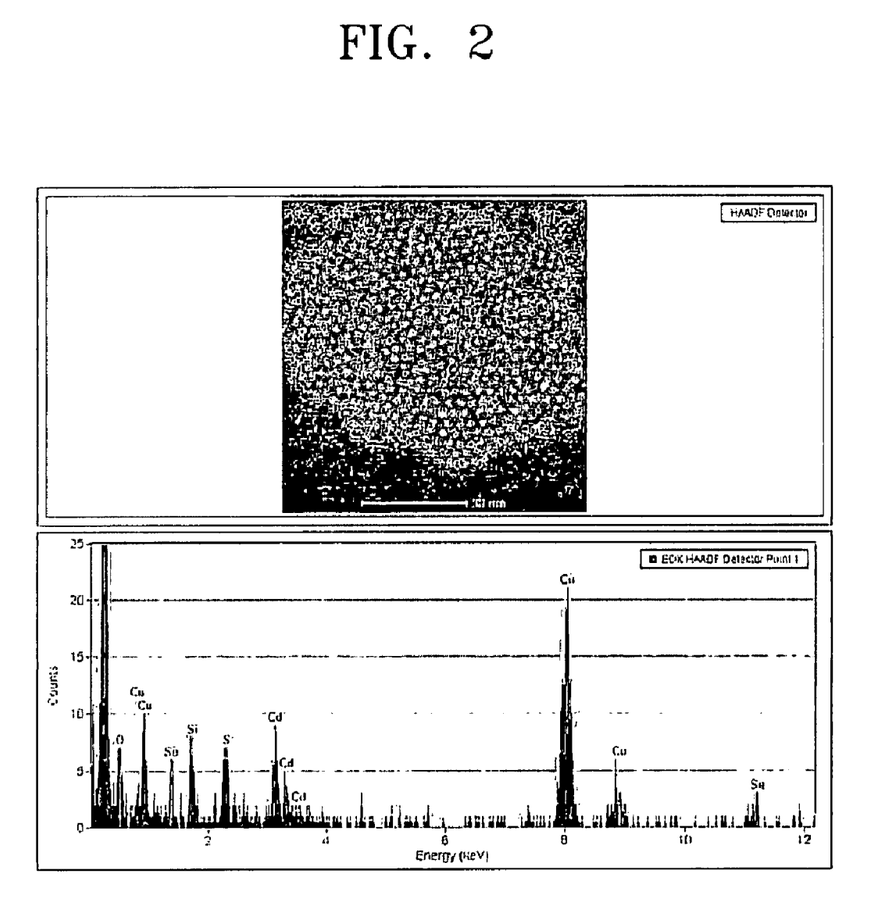
FIG. 2 is a scanning transmission electron microscope (STEM)/energy dispersive spectrometric (EDS) image (scale bar =50 nm) of the CdSeS nanocrystals according to Example 1 of the present invention.

FIG. 2 shows a STEM/EDS image (scale bar=50 nm) of the CdSeS nanocrystals thus obtained. As shown in FIG. 2, the nanocrystals exhibited uniform composition and size distribution.

Figure 3:
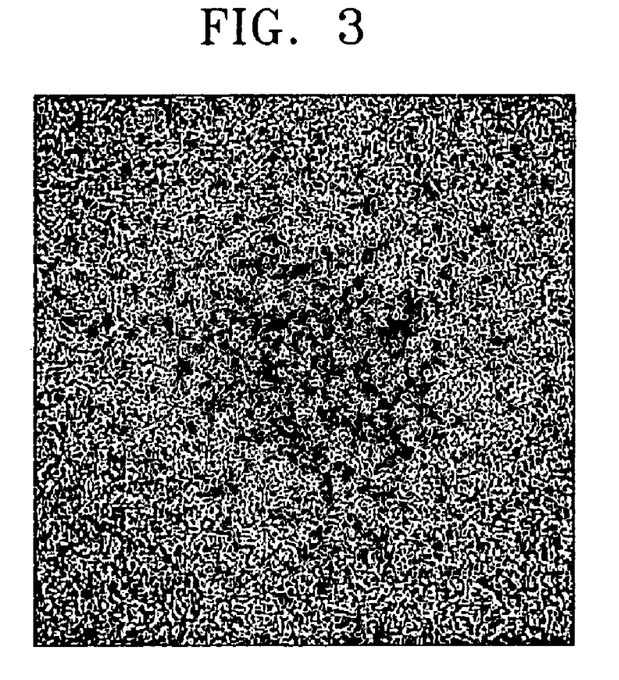
FIG. 3 is a X-ray diffraction spectrum of the CdSeS nanocrystals according to Example 1 of the present invention.

FIG. 3 shows a X-ray diffraction spectrum of the CdSeS nanocrystals thus obtained. As shown in FIG. 3, diffraction patterns of CdSe or CdS crystals were observed.

Figure 4:
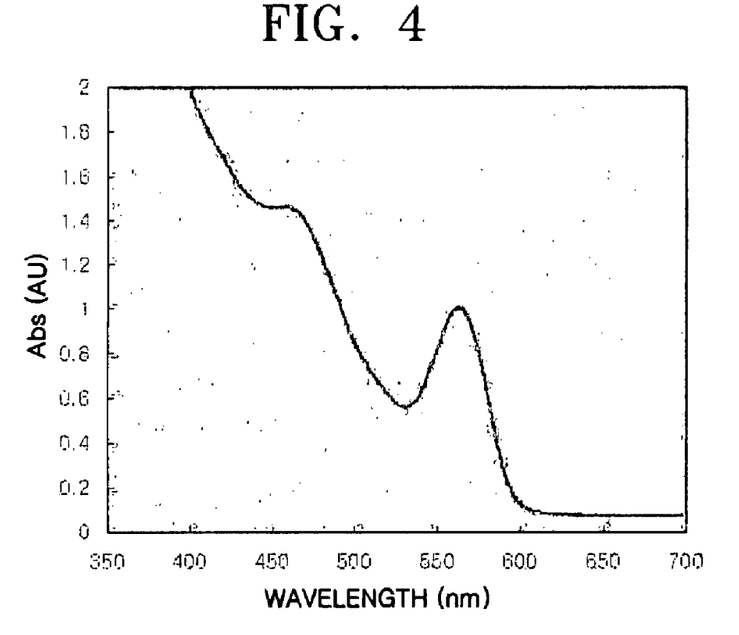
FIG. 4 is an ultraviolet absorption spectrum of the CdSeS nanocrystals according to Example 1 of the present invention.

FIG. 4 shows an ultraviolet absorption spectrum of the CdSeS nanocrystals thus obtained. FIG. 4 shows that the CdSeS nanocrystals are uniform nanocrystals excited by a specific energy.

EXAMPLE 2

Preparation of ZnCdSe Nanocrystals 16 g of TOA, 0.5 g of oleic acid, 0.2 mmol of zinc acetyl acetonate, and 0.2 mmol of cadmium (Cd) oxide were simultaneously placed in a 100 ml flask provided with a reflux condenser and stirred at 300° C. to obtain a Zn and Cd precursor solution.

Separately, Se powders were dissolved in TOP to obtain a Se-TOP complex solution with a Se concentration of about 0.25M. 1 ml of the Se-TOP complex solution was rapidly added to the Zn and Cd precursor solution and stirred for about 2 minutes.

When the reaction of the resultant mixture was terminated, the reaction temperature was rapidly reduced to room temperature and then centrifugation was performed with addition of an ethanol as a non-solvent. A supernatant was decanted and discarded. A precipitate was dispersed in a toluene and then a PL spectrum in the solution was measured.

The PL spectrum showed an emission wavelength of about 456 nm and FWHM of about 26 nm.

EXAMPLE 3

Preparation of CdSe/CdS Nanocrystals 16 g of TOA, 0.5 g of oleic acid, and 0.4 mmol of cadmium acetate were simultaneously placed in a 100 ml flask provided with a reflux condenser and stirred at 300° C. to obtain a Cd precursor solution.

Separately, Se powders were dissolved in TOP to obtain a Se-TOP complex solution with a Se concentration of about 0.25 M. 1 ml of the Se-TOP complex solution was rapidly added to the Cd precursor solution and stirred for about 4 minutes.

S powders were dissolved in TOP to obtain a S-TOP complex solution with a S concentration of about 2 M. 1 ml of the S-TOP complex solution was dropwise added to the CdSe-containing solution and stirred.

When the reaction of the resultant mixture was terminated, the reaction temperature was rapidly reduced to room temperature and then centrifugation was performed with addition of an ethanol as a non solvent. A supernatant was decanted and discarded. A precipitate was dispersed in a toluene and then a PL spectrum in the solution was measured.

The PL spectrum showed an emission wavelength of about 520 nm and FWHM of about 30 nm.

Figure 5:
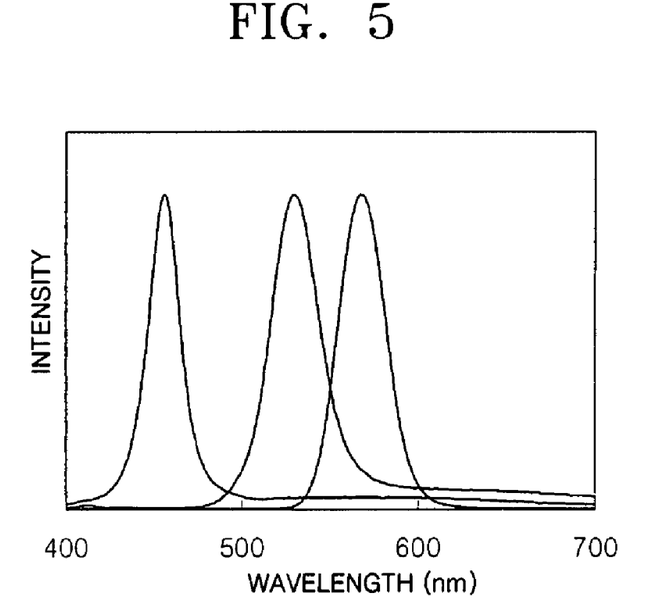
FIG. 5 is a photoluminescence (PL) spectrum of the CdSeS nanocrystals, ZnCdSe nanocrystals, and CdSe/CdS nanocrystals according to Examples 1-3 of the present invention.

FIG. 5 is a photoluminescence (PL) spectrum of the CdSeS nanocrystals, ZnCdSe nanocrystals, and CdSe/CdS nanocrystals according to Examples 1-3 of the present invention. FIG. 5 shows the energy level, size distribution, and luminance efficiency of the crystals.

EXAMPLE 4

Fabrication of Organic EL Device Using CdSeS Nanocrystals

This Example shows fabrication of an organic EL device using the CdSeS nanocrystals according to Example 1 as a light emission material for the organic EL device.

A mixture (1:1, by weight) of the CdSeS nanocrystals and a solution of chloroform of 1 wt % TPD (N,N'-diphenyl-N, N'-bis(3-methylphenyl)-(1,1'-biphenyl)-4,4'-diamine) was spin-coated on a patterned ITO substrate and dried to form a light emission layer with a thickness of 40 nm.

Alq3 (tris-(8-hydroxyquinoline) aluminum) was deposited on the light emission layer to form an electron transport layer with a thickness of 40 nm. Then, Mg and Ag were at a time deposited at an atomic ratio of 10:1 on the electron transport layer to form a cathode with a thickness of 75 nm. This completed the organic EL device.

Figure 6:
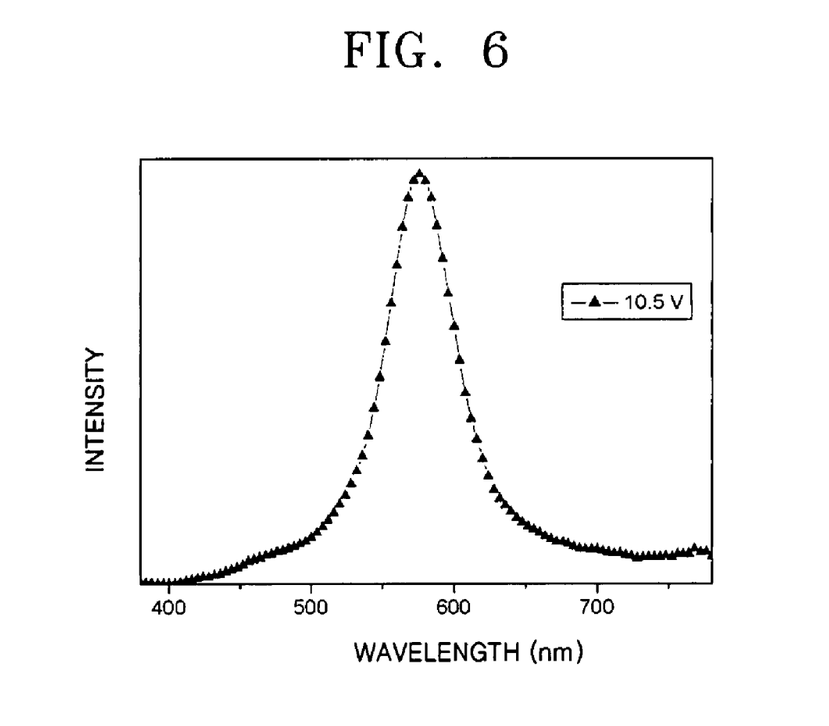
FIG. 6 is an EL spectrum of an organic EL device according to Example 4.

The EL spectrum of the organic EL device showed an emission wavelength of about 520 nm, FWHM of about 40 nm, brightness of 15 Cd/m$^2$, and luminance efficiency of 0.5%. FIG. 6 shows the EL spectrum of the organic EL device according to Example 4.

As apparent from the above descriptions, a chemical wet method according to the present invention provides Group 12-16 compound semiconductor nanocrystals which are stable and have high quantum efficiency and uniform sizes and shapes. Furthermore, one or more Group 12 metals/precursors and one or more group 16 elements/precursors can be made into semiconductor nanocrystals with three or more component alloy or core/shell quantum structures through a one-pot process, which enables adjustment of a bandgap and increase of a luminance efficiency. The semiconductor nanocrystals thus obtained exhibit excellent luminance efficiency at an emission wavelength of 300 to 1,300 nm.

The semiconductor nanocrystals of the present invention can be widely used in the fields of displays, sensors, and energies, in particular, in formation of an organic film such as a light emission layer of an organic EL device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. Semiconductor nanocrystals having three or more component alloy quantum structures comprised of one or more Group 12 metals and one or more Group 16 elements, comprising: ZnSSe, ZnSeTe, ZnSTe, CdSSe, CdSeTe, CdSTe, HgSSe, HgSeTe, HgSTe, ZnHgSSe, or ZnHgSeTe nanocrystal particles, wherein the quantum structures are in shapes of tripods, tetrapods, cubes, boxes, or stars.

2. An organic electroluminescent device comprising an organic film interposed between a pair of electrodes, the organic film comprising semiconductor nanocrystals having three or more component alloy quantum structures comprised of one or more Group 12 metals and one or more Group 16 elements, the semiconductor nanocrystals comprising: ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, CdHgSSe, CdHgSeTe or ZnHgSeTe nanocrystal particles.

3. The organic electroluminescent device of claim 2, wherein the semiconductor nanocrystals have spherical, rod-like, tripodal, tetrapodal, cubic, box-like, or star quantum structures.

* * * * *